(12) United States Patent
Hong

(10) Patent No.: US 7,851,235 B2
(45) Date of Patent: Dec. 14, 2010

(54) TEST ELEMENT GROUP FOR MONITORING LEAKAGE CURRENT IN SEMICONDUCTOR DEVICE AND METHOD OF MANUFACTURING THE SAME

(75) Inventor: Ji-Ho Hong, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 110 days.

(21) Appl. No.: 12/172,218

(22) Filed: Jul. 12, 2008

(65) Prior Publication Data
US 2009/0014718 A1 Jan. 15, 2009

(30) Foreign Application Priority Data
Jul. 13, 2007 (KR) .................. 10-2007-0070554

(51) Int. Cl.
*G01R 31/26* (2006.01)
(52) U.S. Cl. .................. 438/14; 438/17; 438/18; 257/48; 257/E21.476; 257/E21.521; 257/E21.531
(58) Field of Classification Search .................. 257/48; 438/14–18
See application file for complete search history.

(56) References Cited
U.S. PATENT DOCUMENTS
6,074,904 A * 6/2000 Spikes et al. ................ 438/223

| | | | |
|---|---|---|---|
| 2002/0005553 A1* | 1/2002 | Ootsuka et al. | 257/369 |
| 2003/0038653 A1* | 2/2003 | Ooishi et al. | 326/33 |
| 2006/0118784 A1* | 6/2006 | Lee et al. | 257/48 |
| 2007/0194213 A1* | 8/2007 | Augusto | 250/214.1 |
| 2009/0057664 A1* | 3/2009 | Lim et al. | 257/48 |

\* cited by examiner

*Primary Examiner*—A. Sefer
(74) *Attorney, Agent, or Firm*—Sherr & Vaughn, PLLC

(57) ABSTRACT

A test element group for monitoring leakage current in a semiconductor device and a method of manufacturing the same are disclosed. The test element group for monitoring leakage current in a semiconductor device includes device isolation layers formed over a first conductivity type semiconductor substrate. A second conductivity type well may be formed over the first conductivity type semiconductor substrate. First conductivity type impurity regions may be formed in first active areas between the device isolation layers in the second conductivity type well. Monitoring contacts may be formed within the first active areas to monitor leakage current, using layout data such that a distance from each of the monitoring contacts to a border of each of the first active areas is set to have an allowable minimum value under a predetermined design rule. Accordingly, the test element group can monitor leakage current caused by PN junction diodes formed by junction of the impurity regions and the well in the active areas in a semiconductor device or misalignment of contacts, and can accurately monitor micro-leakage current in a semiconductor device during manufacturing.

6 Claims, 7 Drawing Sheets

TEST ELEMENT GROUP FOR MONITORING LEAKAGE CURRENT IN SEMICONDUCTOR DEVICE AND METHOD OF MANUFACTURING THE SAME

The present application claims priority under 35 U.S.C. 119 to Korean Patent Application No. 10-2007-0070554 (filed on Jul. 13, 2007), which is hereby incorporated by reference in its entirety.

BACKGROUND

In the manufacture of semiconductor memory devices, process margins for lithography are decreased as the degree of device integration is increased. Specifically, when misalignment occurs, that is, layers of a semiconductor device are not effectively aligned in lithography, the resulting semiconductor device may be defective and yield may be reduced.

When contacts fail to efficiently connect the source/drain of a transistor with metal wires due to misalignment, leakage current increases sharply. Besides the increase in leakage current due to this abnormal process condition, diode leakage current due to an inadequate implant process condition in a PN junction diode region formed between a source/drain region and a well region also considerably affects the characteristics of the device.

Specifically, to make a more competitive device, a flash memory device should retain written data for a long time, while increasing the degree of integration in cell regions. From this point of view, the manufacture of a flash memory device below 90 nm requires the capability of rapidly and accurately detecting even a small change in a process. In the case of flash memory devices below 90 nm, when contacts land on an active area, high precision is required. If a margin for overlay misalignment in a process is not sufficient, increased leakage current inevitably occurs, causing fatal errors to data retention in a flash memory device. The deterioration of data retention performance also results from leakage current of the aforementioned PN junction diode formed between the source/drain and a well.

To monitor for errors in manufacturing processes of semiconductor devices, a test element group for monitoring may be provided in a scribe line between dies. The test element group includes a pattern for measuring leakage current at a PN junction. Such a pattern may have a structure which includes a plurality of contacts formed in a wide active area, in which a well and a PN junction are formed.

Figure 1A:
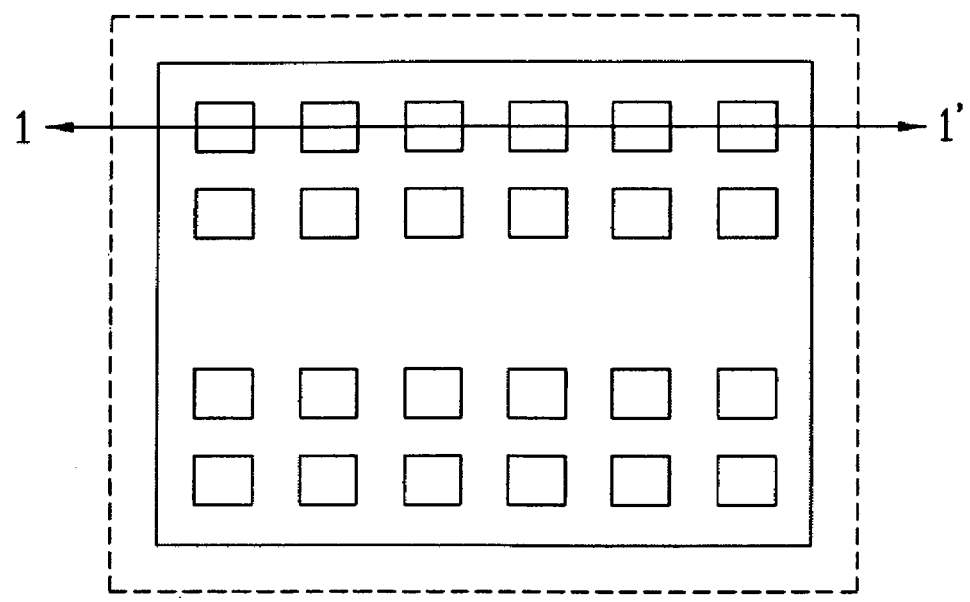
Figure 1B:
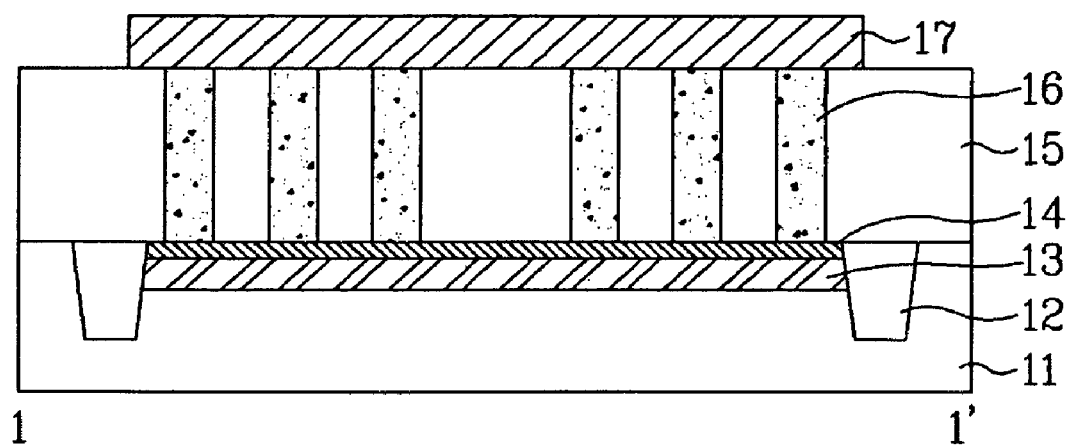

FIG. 1A is a top view illustrating a test element group for monitoring used to measure leakage current, and FIG. 1B is a cross-sectional view taken along line 1-1' of FIG. 1A. As shown in FIG. 1B, a test element group for monitoring includes device isolation layers 12 formed in a semiconductor substrate 11. A PN junction 13 including a well and an impurity layer may be formed by an ion injection process in an active area separated by the device isolation layers 12. A titanium or cobalt silicide layer 14 may be formed over the PN junction 13 to reduce contact resistance. The silicide layer 14 is connected to a first metal layer 17 through contacts 16 formed subsequently thereto. A pre-metal dielectric (PMD) layer 15 acts as an insulating layer which fills an area between the first metal layer 17 and the active area.

By using the test element group for monitoring with the above structure, leakage current generated at the PN junction 13 due to abnormality of process conditions, can be monitored. Abnormalities in the amount of impurities injected in the ion injection process, an ion injection energy and a thickness of the silicide layer 14 may be monitored. The leakage current can be calculated by applying a certain voltage to the first metal layer 17 and a second metal layer, which is connected to well pickup contacts formed in the well of the PN junction 13, and measuring current flowing through the PN junction 13. For example, anode (positive) voltage may be applied to the first metal layer 17 where the junction is an N+-type active area and a P-type well, and cathode (negative) voltage is applied to the first metal layer 17 where the junction is a P+-type active area and an N-type well. However, in the pattern having the above structure, even when misalignment occurs between the contacts 16 and the active area in lithography, a contact area between the contacts 16 and the active area is not changed. Therefore, the leakage current is not increased sharply.

To determine whether the leakage current is generated by misalignment of the contacts 16 and to detect the leakage current due to the misalignment of the contacts 16, a new test element group suitable to accomplish such purposes is required. Up to now, there has not been a test element group capable of effectively monitoring the leakage current due to overlay misalignment of the contacts 16 on the active area, and accurately monitoring the leakage current features in the PN junction diode region formed between the source/drain and the well.

SUMMARY

Embodiments relate to a test element group (TEG) for monitoring leakage current in a semiconductor device and a method of manufacturing the same, and more particularly, to a test element group for monitoring leakage current caused by PN junction diodes formed by junction of impurity regions and a well in active areas in a semiconductor device or misalignment of contacts, and a method of manufacturing such a test element group. Embodiments relate to a test element group for monitoring leakage current in a semiconductor device and a method of manufacturing the same that can effectively monitor misalignment of contacts formed within active areas and leakage current due to the misalignment, and can accurately monitor micro-leakage current features in PN junction diode regions formed between impurity regions and a well in the active areas.

Embodiments relate to a method of manufacturing a test element group for monitoring leakage current in a semiconductor device which includes forming device isolation layers over a first conductivity type semiconductor substrate. The method further includes forming a second conductivity type well over the first conductivity type semiconductor substrate and forming first conductivity type impurity regions in first active areas of active areas defined by areas between the device isolation layers in the second conductivity type well. The method includes forming monitoring contacts within the first active areas to monitor leakage current.

Embodiments relate to a test element group for monitoring leakage current in a semiconductor device includes device isolation layers formed over a first conductivity type semiconductor substrate. A second conductivity type well may be formed over the first conductivity type semiconductor substrate. First conductivity type impurity regions may be formed in first active areas between the device isolation layers in the second conductivity type well. Monitoring contacts may be formed within the first active areas to monitor leakage current. Here, "monitoring contacts" refer to contacts which are subjected to misalignment test.

DRAWINGS

FIGS. 1A and 1B are views illustrating a related test element group for monitoring leakage current in a semiconductor device.

Example FIGS. 2A to 2D are views illustrating a test element group for monitoring leakage current in a semiconductor device according to embodiments.

Figure 3A:
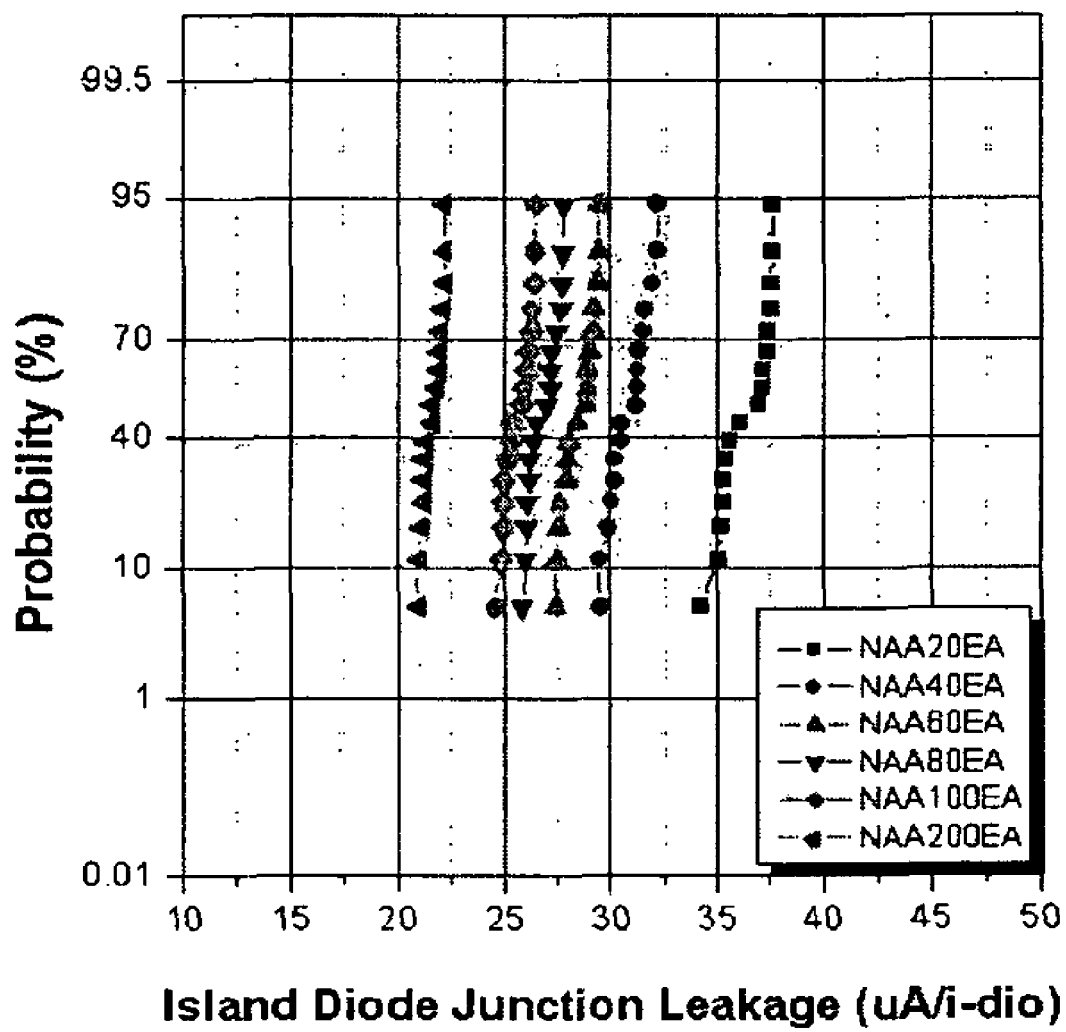
Figure 3B:
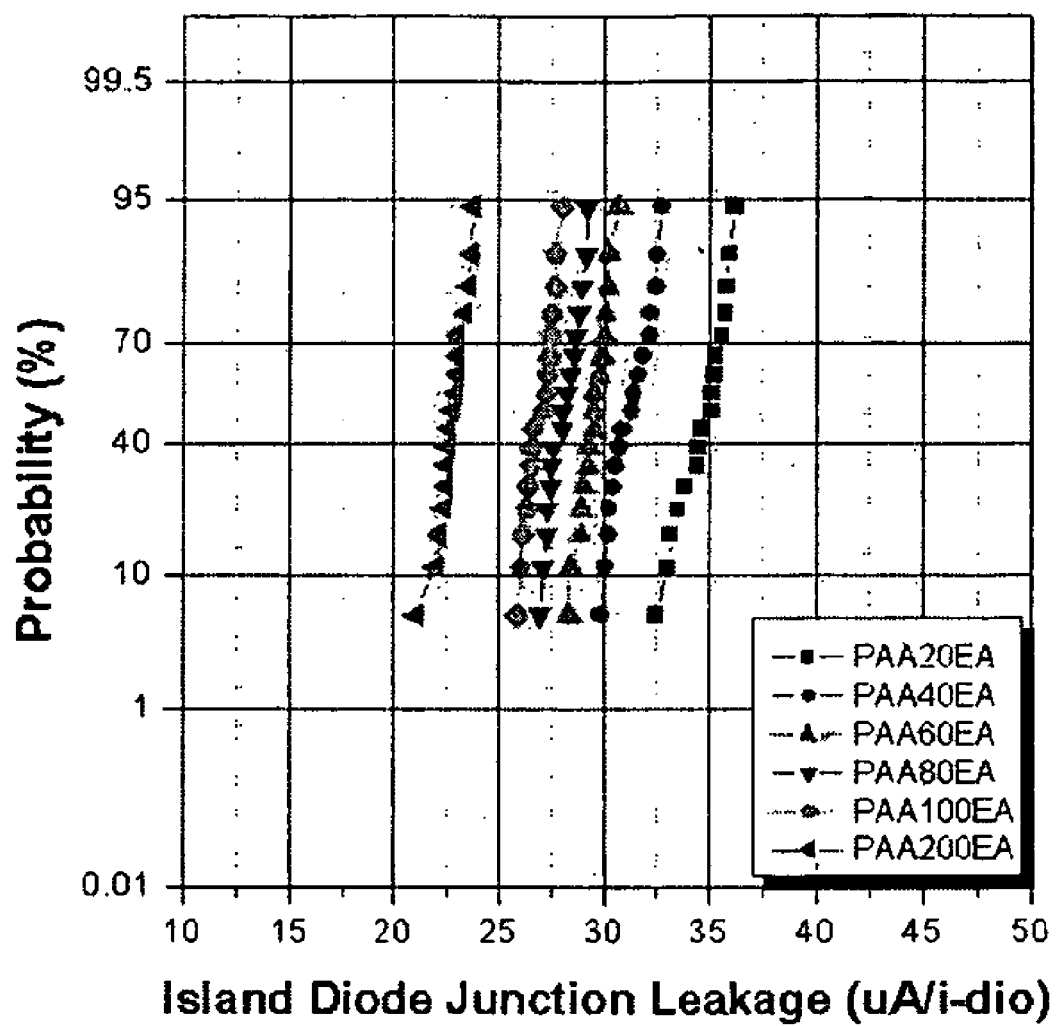

Example FIGS. 3A and 3B are views showing leakage current measured from the test element group for monitoring leakage current in a semiconductor device according to embodiments.

DESCRIPTION

Example FIGS. 2A to 2D are views illustrating a test element group for monitoring leakage current in a semiconductor device according to embodiments. Referring to example FIG. 2A, a test element group (TEG) for monitoring leakage current (hereinafter, referred to as a "monitoring TEG") comprises a first metal line (M11) 202 and a second metal line (M12) 204, serving as both electrodes for leakage current measurement. A plurality of active areas 210 having a tetragonal island-shape, and monitoring contacts (M1C) 208 may be respectively formed within the active areas 210 to detect misalignment of contacts and leakage current due to the misalignment. Well pickup contacts 206 serve to transmit the leakage current flowing through a well to the second metal line 204.

Figure 2A:
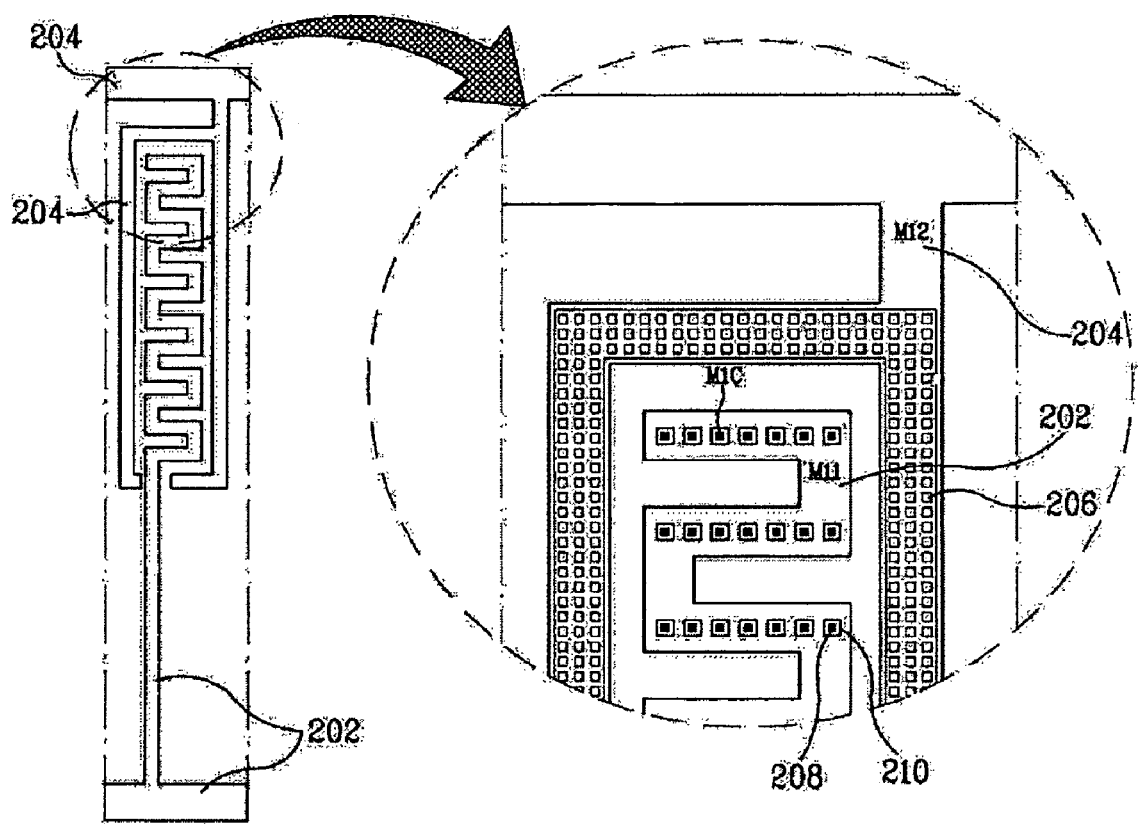
Figure 2B:
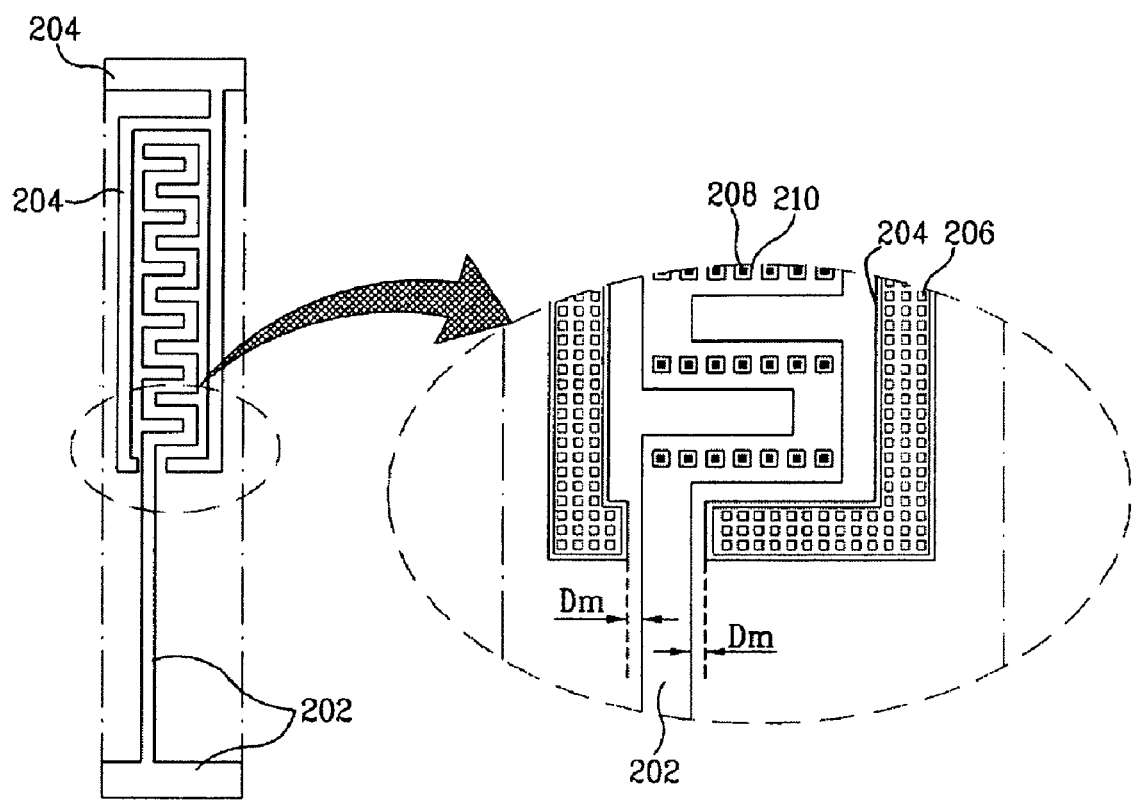
Figure 2C:
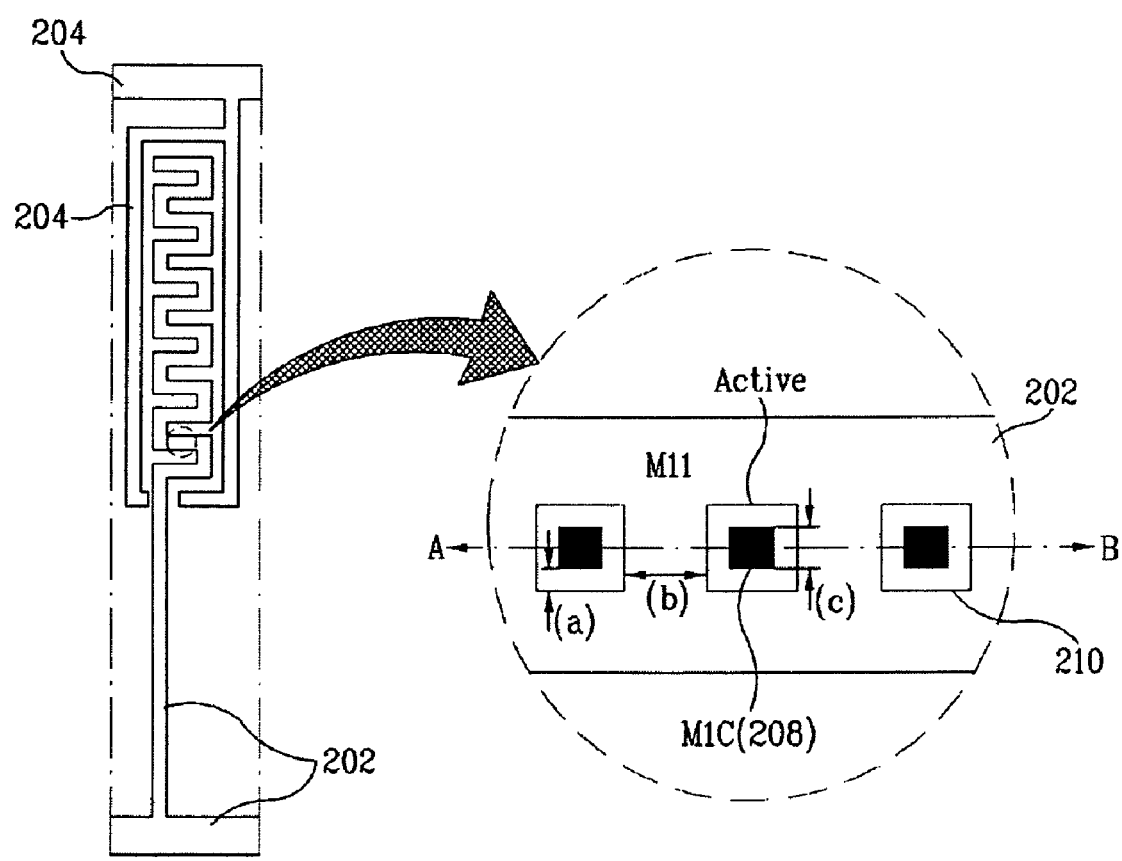
Figure 2D:
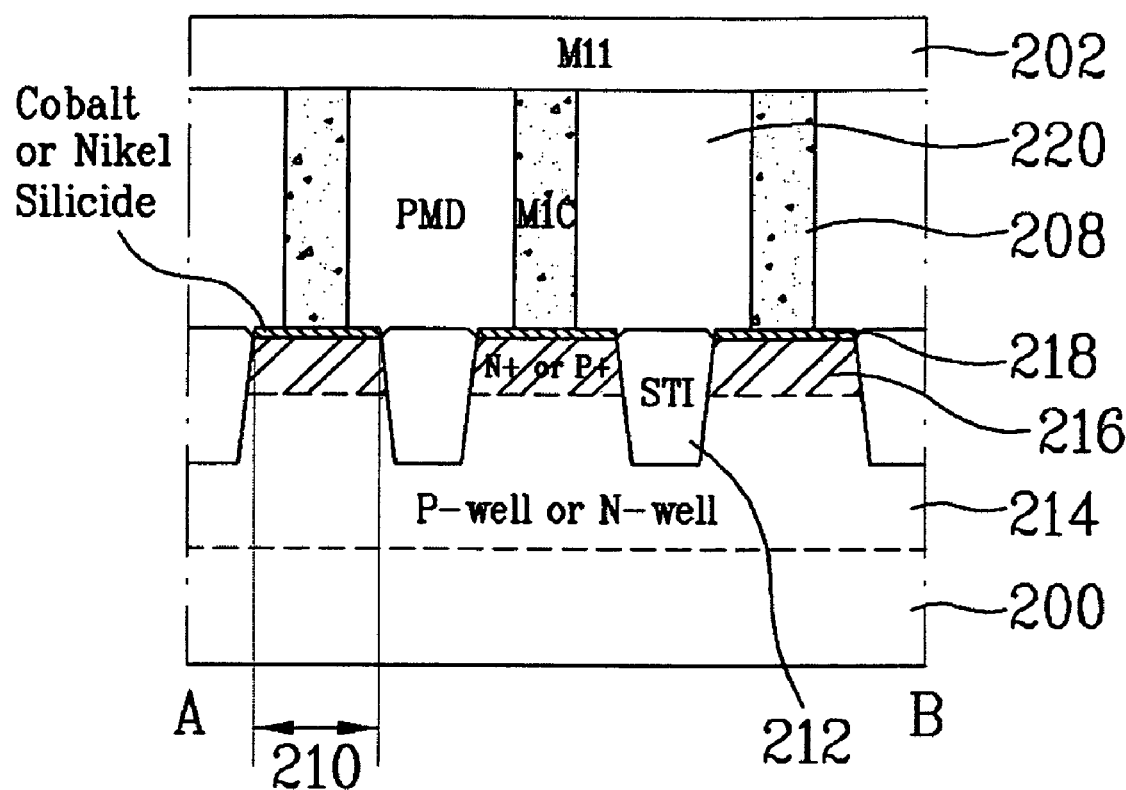

As shown in example FIG. 2D, a second conductivity type well 214 may be formed over a first conductivity type semiconductor substrate 200. First conductivity type impurity regions 216 may be formed in the second conductivity type well 214. The areas, in which the first conductivity type impurity regions 216 may be formed, may be defined as the active areas 210. The active areas 210 may be formed to represent the areas in which a transistor including source/drain is formed. STI regions 212 may be formed as device isolation layers between the active areas 210.

Leakage current flows through a PN junction diode region formed by the second conductivity type well 214 and the first conductivity type impurity region 216 in each of the active areas 210. If the monitoring contacts 208 are misaligned due to process abnormalities, the monitoring contacts 208 do not contact the active areas 210 but are connected to the STI regions 212. In this case, a large amount of leakage current flows.

To easily detect the misalignment of the monitoring contacts 208 and the resulting leakage current, a distance from each monitoring contact 208 to the border of each active area 210 is laid out to have an allowable minimum value under a design rule. The active areas 210 are formed using the layout data. Thus, when a process abnormality occurs, the monitoring contacts 208 are prone to be misaligned, and leakage current is increased sharply.

To measure even very small leakage currents, the active areas 210 and the monitoring contacts 208 formed within the active areas 210 may be arranged to resemble a plurality of islands. The monitoring contacts 208 are connected to each other by the first metal line 202. The leakage current flows through the first metal line 202, the monitoring contacts 208, the first conductivity type impurity regions 216 and the second conductivity type well 214. By forming a plurality of well pickup contacts 206 to measure the current, the leakage current flowing through the second conductivity type well 214 flows to the second metal line 204 which connects the well pickup contacts 206. The well pickup contacts 206 may be formed within well pickup active areas formed in the second conductivity type well 214.

A group of well pickup contacts 206 may be arranged to surround a group of active areas 210 and monitoring contacts 208 formed within the active areas 210 which are arranged like a plurality of islands, thereby absorbing as much leakage current flowing through the second conductivity type well 214 as possible. The leakage current can be calculated by applying certain voltage to the first metal line 202 and the second metal line 204 and measuring current flowing therethrough.

Example FIG. 2B is a top view illustrating another portion of the monitoring TEG according to embodiments. The first metal line 202 and the second metal line 204 are formed over the same metal layer and do not overlap. Referring to example FIG. 2B, for a group of well pickup contacts 206 to proximally surround a group of monitoring contacts 208 without overlapping of the first metal line 202 and the second metal line 204, a distance Dm between the first metal line 202 and the second metal line 204 is set to have an allowable minimum value under a design rule.

Example FIG. 2C is an enlarged top view illustrating the active areas 210 and the monitoring contacts 208 formed within the active areas in the monitoring TEG according to embodiments. Each of the active areas 210 may be formed in a tetragonal island-shape, and each of the monitoring contacts 208 may be formed within each active area 210. Each monitoring contact 208 may be disposed at a distance (a) from the border of each active area 210. The adjacent active areas 210 are spaced apart from each other by a distance (b). Each monitoring contact 208 has a predetermined size (c).

According to embodiments, each of the monitoring contacts 208 is formed within each of the active areas 210, by using the layout data such that the distance (a) from each monitoring contact 208 to the border of each active area 210 is designed to have an allowable minimum value under a design rule. As needed, the monitoring TEG may be manufactured based on other layout data such that the distance (b) between the adjacent active areas 210 and the size (c) of each monitoring contact 208 are varied, so as to monitor leakage current under various conditions.

Example FIG. 2D is a cross-sectional view taken along line A-B of example FIG. 2C illustrating a monitoring TEG according to embodiments. A method of manufacturing the monitoring TEG will now be explained with reference to example FIG. 2D. First, the STI regions 212 may be formed as the device isolation layers over the first conductivity type semiconductor substrate 200. The second conductivity type well 214 may be formed by ion injection, and the first conductivity type impurity regions 216 may be formed in the second conductivity type well 214. The areas, in which the first conductivity type impurity regions 216 are formed, may be defined as the active areas 210.

The second conductivity type well 214 and the first conductivity type impurity regions 216 may be formed according to process conditions of forming a well region and a source or drain region in a memory cell. The PN junction diode regions may be formed at junction portions of the second conductivity type well 214 and the first conductivity type impurity regions 216. The PN junction diode regions may be isolated by the STI regions 212, and thus have an island diode-shape. The leakage current subjected to monitoring flows through the PN junction diode regions. Subsequently, cobalt or nickel silicide layers 218 may be formed over the first conductivity type impurity regions 216. This is for reducing contact resistance between the monitoring contacts 208, which will be formed later, and the first conductivity type impurity regions 216.

Thereafter, the monitoring contacts 208 and the insulating pre-metal dielectric (PMD) layer 220 are formed over the first conductivity type impurity regions 216. The first metal line 202 may be formed to connect the upper end portions of the monitoring contacts 208. Although not shown in example FIG. 2D, the well pickup contacts 206 may be formed in the well pickup active regions in the second conductivity type well 214. The second metal line 204 is formed to connect the well pickup contacts 206. If the contacts are misaligned due to a process abnormality, the monitoring contacts 208 would lie over the borders between the active areas 210 and the STI regions 212, and a large amount of leakage current would be generated.

Example FIGS. 3A and 3B are graphs showing junction leakage current at the island-shaped PN junction diode regions, which is measured from the monitoring TEG according to embodiments. A horizontal axis of each of the graphs of example FIGS. 3A and 3B indicates a value of the junction leakage current (unit: uA) detected from one island diode. This is calculated by dividing the leakage current measured from the monitoring TEG having a plurality of island diodes by the number of the island diodes. The vertical axis indicates detection probability (unit: %). Example FIG. 3A illustrates a case where the monitoring TEG has N+-type impurity regions and a P-type well (the first conductivity type is an N-type). Example FIG. 3B shows a case where the monitoring TEG has P+-type impurity regions and an N-type well (the first conductivity type is a P-type). The experiments were carried out under the conditions where the monitoring TEGs had 20, 40, 60, 80, 100 and 200 island diodes, respectively, and a voltage of 1V was applied to the monitoring TEGs to measure leakage current.

Referring to example FIGS. 3A and 3B, the experimental results indicate the junction leakage current of each island diode, which was measured from the monitoring TEG during the process of manufacturing a flash memory device of 90 nm. According to the experimental results, as the number of the island diodes of the monitoring TEG is increased, the leakage current level detected from each island diode is decreased.

Such results can be commonly observed from example FIGS. 3A and 3B. From the experimental results, it can be seen that as the number of the island diodes is increased when monitoring junction leakage current of a semiconductor device, the detecting ability is enhanced, because even micro-leakage current can be measured. Also, it can be seen that 100 or more island diodes may create preferable results.

Experiments made with the monitoring TEG having 200 island diodes in example FIG. 3A indicate that the leakage current level detected from each island diode is substantially 22 uA. Example FIG. 3B indicates that the detected leakage current level is substantially 23.5 uA. Such experimental results prove that the monitoring TEG according to embodiments can be effectively used during the manufacture of a semiconductor device.

Although it has been described that the first conductivity type may be a P-type and the second conductivity type may be an N-type, a semiconductor device can also be manufactured so that the first conductivity type may be an N-type and the second conductivity type is may be P-type. As described above, the TEG for monitoring leakage current in a semiconductor device and the method of manufacturing the same according to embodiments can effectively monitor the misalignment of contacts formed within the active areas and leakage current due to misalignment. It may also accurately monitor micro-leakage current features in the PN junction diode regions formed between the impurity regions and the well in the active areas.

Further, since deterioration in the quality of a semiconductor device due to leakage currents can be accurately monitored in advance, the yield in semiconductor device manufacturing can be improved through process management using the monitoring TEG according to embodiments. As a result, manufacturing costs of a semiconductor device can be reduced.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
forming device isolation layers over a first conductivity type semiconductor substrate;
forming a second conductivity type well over the first conductivity type semiconductor substrate;
forming first conductivity type impurity regions in first active areas of active areas defined by areas between the device isolation layers in the second conductivity type well;
forming silicide layers over the first conductivity type impurity regions;
forming monitoring contacts within the first active areas to monitor leakage current to detect misalignment of contacts and leakage current due to the misalignment;
forming well pickup contacts within second active areas to surround the monitoring contacts, thereby absorbing leakage current flowing through the second conductivity type well;
forming a first metal line to connect the monitoring contacts; and
forming a second metal line to connect the well pickup contacts formed within the second active areas,
wherein both the first metal line and the second metal line are serving as electrodes for leakage current measurement,
wherein the device isolation layers, the second conductivity type well, the first conductivity type impurity regions, and the monitoring contacts as a test element group for monitoring leakage current in a semiconductor device,
wherein the silicide layers are formed to reduce contact resistance between the monitoring contacts and the first conductivity type impurity regions.

2. The method of claim 1, wherein forming the monitoring contacts includes using layout data such that a distance from each of the monitoring contacts to a border of each of the first active areas is set to have an allowable minimum value under a predetermined design rule.

3. The method of claim 1, comprising, before forming the monitoring contacts within the first active areas forming titanium silicide layers over the first active areas.

4. The method of claim 1, comprising, before forming the monitoring contacts within the first active areas forming cobalt silicide layers over the first active areas.

5. The method of claim 1, comprising forming the device isolation layers, second conductivity type well, first conductivity type impurity regions, and monitoring contacts in a scribe line region between dies on a semiconductor wafer.

6. The method of claim 1, wherein leakage current from a plurality of test element groups is measured and averaged.

* * * * *